Aug. 29, 1967 C. M. PELANNE 3,339,002

INTEGRAL MOLDING METHOD OF MAKING A THERMOELECTRIC GENERATOR

Filed Nov. 1, 1961 4 Sheets-Sheet 1

INVENTOR.
CHARLES M. PELANNE
BY John A. McKinney
ATTORNEY

Aug. 29, 1967 C. M. PELANNE 3,339,002

INTEGRAL MOLDING METHOD OF MAKING A THERMOELECTRIC GENERATOR

Filed Nov. 1, 1961 4 Sheets-Sheet 2

INVENTOR.
CHARLES M. PELANNE
BY John A. McKinney
ATTORNEY

INVENTOR.
CHARLES M. PELANNE
BY John A. McKinney
ATTORNEY

INTEGRAL MOLDING METHOD OF MAKING A THERMOELECTRIC GENERATOR

Filed Nov. 1, 1961 4 Sheets-Sheet 4

INVENTOR.
CHARLES M. PELANNE
BY John A. McKinney
ATTORNEY

United States Patent Office 3,339,002

Patented Aug. 29, 1967

3,339,002

INTEGRAL MOLDING METHOD OF MAKING A THERMOELECTRIC GENERATOR

Charles M. Pelanne, Somerville, N.J., assignor to Johns-Manville Corporation, New York, N.Y., a corporation of New York Filed Nov. 1, 1961, Ser. No. 149,243
3 Claims. (Cl. 264—255)

This invention relates generally to the measurement of heat flow and relates particularly to the provision of and method of manufacturing a new and improved thermoelectric generator. More particularly, this invention relates to a thermoelectric generator in the form of a thermopile fixedly positioned in a thermal resistance and which thermoelectric generator is adaptable to operate in conjunction with heat flow measurement apparatus.

A thermopile comprises a plurality of connected thermocouples. A thermocouple is usually formed of wires having dissimilar thermoelectric properties. If alternate junctions of the dissimilar wires are interconnected and positioned at different thermal planes of a fixed thermal resistance, an electric current may be generated which is proportional to the temperature drop across its thermopile elements. The operation and calibration of heat flow meters incorporating thermopiles is known in the art and is adequately described in U.S. Patent No. 2,493,651, Boelter et al.

In forming thermoelectric generators, it is the usual practice to wind a thermopile wire, comprising dissimilar metals and having a plurality of junctions between such dissimilar metals, around a form member or to lace such wire through apertures of a form member. While the practice of winding the thermopile wire around a form facilitates the rapid formation of a thermoelectric generator, the number and arrangement of the junctions are limited and no provision is made for positively fixing the position of the thermopile wire on the form member. In continued and rugged service the wire shifts on the form member to cause adjacent turns to "short" and/or to require recalibration of the thermoelectric generator.

Weaving has been heretofore suggested as a method of assembling thermopile wires in a positioning form, however, in such prior suggested devices the positioning forming has been of flexible material, such as cork or cellulose acetate. Cork and cellulose acetate are satisfactory for use as thermal resistance at temperatures up to 200° F., and therefore the range of application is limited. Another disadvantage concomitant with the use of such compressible and flexible materials as cellulose acetate and cork is that the characteristics of the heat flow meter vary with the degree of compression and deformation and therefore accurate results are only obtained when the calibration conditions are duplicated. Basket weaving of cellulose strips through a thermocouple chain is disclosed in a paper entitled, "A Low Inertia Low-Resistance Heat Flow Meter."[1] Basket weaving of thermopile wire through a slotted cork pad is disclosed in a Paper entitled, "Conductimeters, Their Construction and Use."[2] Both of these prior disclosures involve a tedious process of interlacing which is unsatisfactory for use in connection with comparatively rigid thermal resistance positioning forms.

[1] R. G. Huebscher et al., ASH & VE Trans., No. 1453, June 1952.
[2] C. F. Gilbo, ASTM Bulletin No. 212, February 1956.

Therefore, it is an object of this invention to provide new and improved method and apparatus for rapid and economical forming of thermoelectric generators on a mass production basis.

Another object of this invention is to provide a thermoelectric generator adapted to operate in conjunction with heat flow measuring meters employed in comparatively rugged service conditions and which will maintain its calibration during such service.

Still another object of this invention is to provide a thermoelectric generator which is not subject to deformation at elevated or other diverse operating temperatures.

Generally, this invention is directed to the design which facilitates manufacture on a mass production basis and to the manufacture of a thermopile suitable for use in heat flow measuring meters in which a thermopile wire is comprised of alternate lengths of metals having dissimilar thermoelectric properties, in which the wire is positioned at or near the surface of a thermal resistance material and is undulated so that alternate junctions between the dissimilar metals are at different thermal planes, in which the wire is fixedly positioned, without the need of adhesives, on an uncompressible positioning form.

A heat meter incorporating a preferred embodiment of this invention comprises an electrical insulating plate having a central area defining a thermoelectric generator therein; an insulating cover over each side of said plate and forming an integral unit therewith; said central area comprising a thermopile positioning form of electrical insulating material capable of substaining temperatures of −300° F. to 500° F., said form having similarly patterned rows of alternate crests and valleys with the pattern in one row being off-set with respect to the patterns of the next adjacent rows; a plurality of interconnected thermopile strips forming a thermopile chain embedded in said form, each of said strips comprising alternate lengths of metals having dissimilar thermoelectric characteristics with alternate junctions of the dissimilar metal lengths being positioned at different thermal planes on said form; a thermocouple positioned at each of two opposing surfaces of the thermoelectric generator; and a suitable potentiometer for measuring the temperatures of the surfaces through which the heat flow is being measured.

Among the advantages which the present invention provides are simplicity in fabrication; structure stability during rugged and continued service and which structure restrains relative movement of the thermopile strips and insulating material; structure which is capable of sustaining elevated and diverse temperatures from −300° F. to +500° F.; a thermoelectric generator in which an increased number of junctions between dissimilar metals may be provided per unit volume to increase the E.M.F. (electromotive force); a thermoelectric generator which may be employed in heat flow meters to measure the mean flow between thermal planes having temperatures in the range of −300° F. to +750° F.; a liquid impervious structure suitable for measuring heat flow through liquids; and an uncompressible and undeformable structure which enhances duplication of the calibration conditions during testing and hence provides more accurate readings.

Further objects and advantages of this invention will appear from the following description of a species thereof and from the accompanying drawings, in which.

Figure 1:
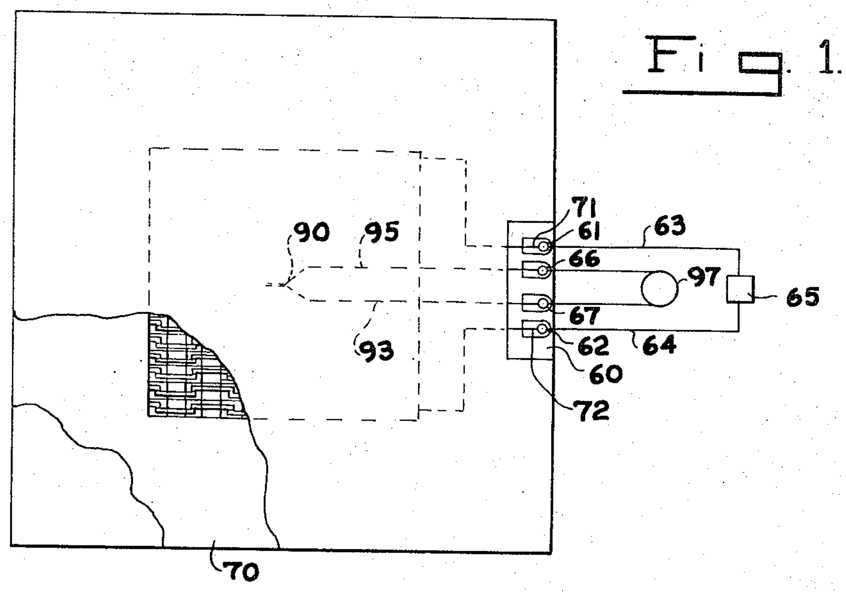
FIG. 1 is a plan view, with portions "broken away," of a heat flow meter embodying the invention.
Figure 2:
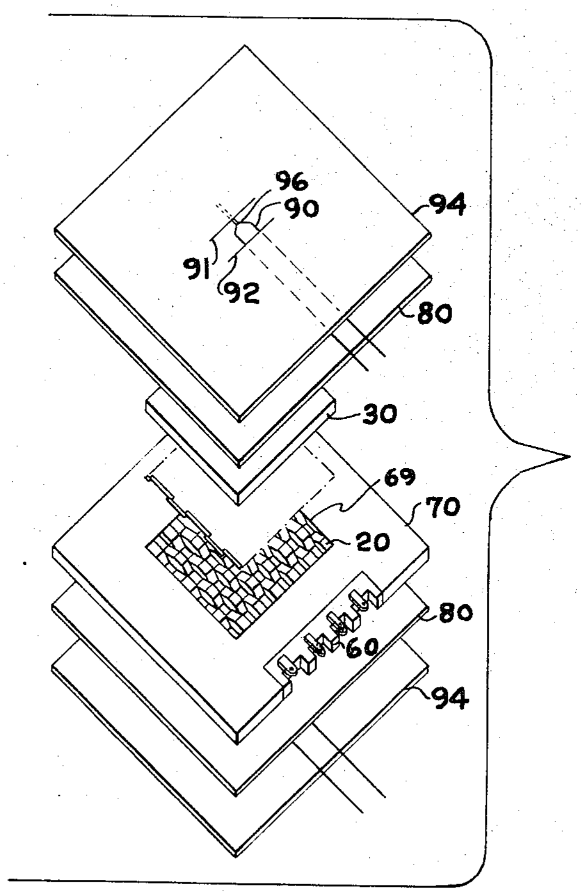
FIG. 2 is an "exploded" pictorial view of the preferred embodiment of the thermoelectric generator of this invention.
Figure 3:
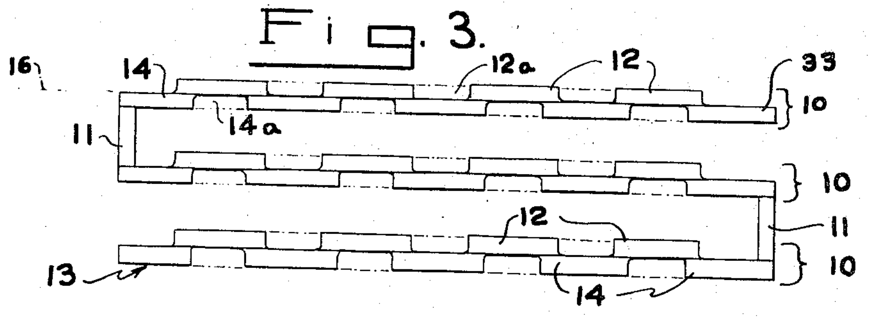
FIG. 3 is a fragmentary plan view of one form of thermopile chain, before folding, that may be employed in this invention.

In FIG. 3 there is illustrated two metal wires having dissimilar thermoelectric characteristics and suitably connected together, as by welding, along longitudinal line 16 to form a strip 10. Portions 12*a* and 14*a* of the strip 10 are suitably removed, as by notching, from alternate sides of the line 16 to form a row of alternate lengths of metal 12 joined at line 16 with a row of alternate lengths consisting of dissimilar metal 14 to provide the thermopile strip 10. A series of strips 10 are joined by connections 11 to form a thermopile chain 13.

Figure 4:
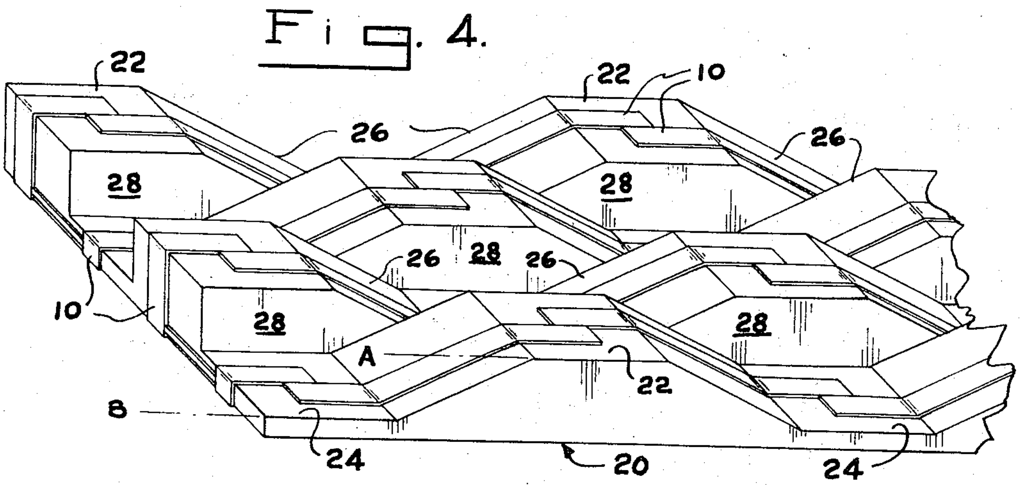
FIG. 4 is a fragmentary pictorial view of the preferred positioning form base of this invention together with a thermopile chain.
Figures 5, 13:
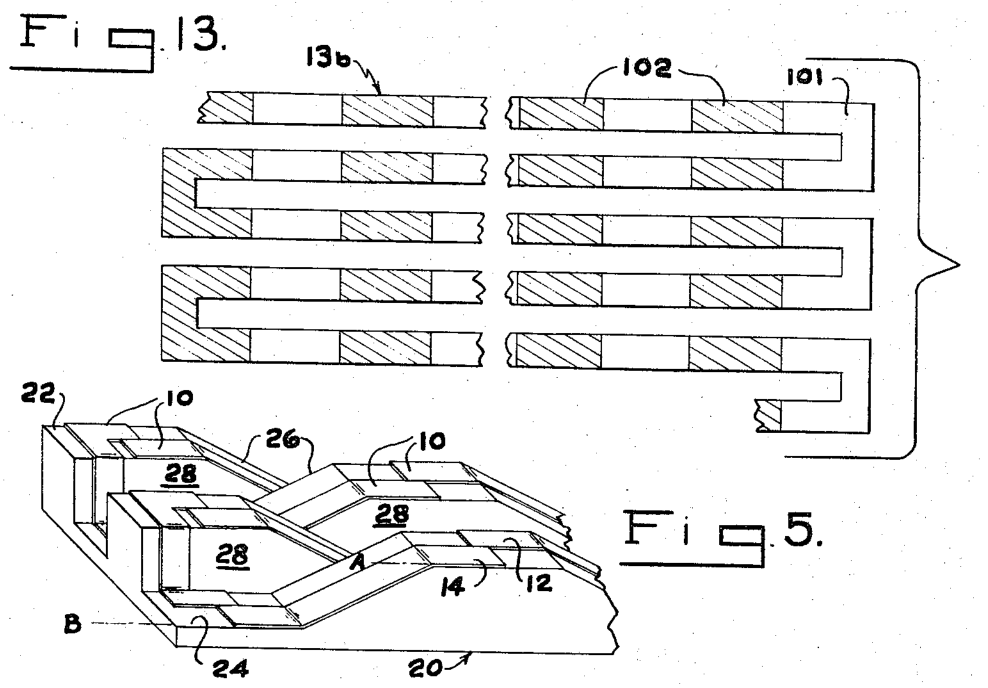
FIG. 5 is a view similar to FIG. 4 illustrating an alternate manner of positioning the connecting members and joining the adjacent strips forming a thermopile chain.
FIG. 13 is a plan view illustrating an alternate form of thermopile chain.

The thermopile positioning form illustrated in FIG. 4 comprises a base member 20 molded from suitable thermal resistant material, preferably asbestos paper impregnated with phenolic resin and laminated to provide the desired thickness. The asbestos imparts strength to the molded structure and also serves as a deterrent to blistering of the resinous component. The base member 20 is undulated or embossed to provide two opposing planes of faces A and B at different elevations, each of the faces defining a thermal plane to receive junctions of a thermopile. The pattern of the faces is such to provide rows of alternate crests 22 and valleys 24 interconnected by oblique areas 26. The pattern is the same in each row, however, it is preferred to stagger the crests 22 of one row in relation to the crests of the adjacent row or rows. In such arrangement adjacent oblique areas 26 slope in opposite directions and lateral surfaces 28 are provided against which a thermopile wire can abut and be prevented from coming into contact with a strip positioned in an adjacent row of crests and valleys. For clarity of illustration in FIG. 4, the widths of the undulations, in the form of crests 22 and valleys 24, are shown to be substantially greater than the width of the strips 10. Alternatively, as illustrated in FIG. 5 the widths of the undulations are substantially equal to the width of the strips 10. It is also to be understood that the connecting areas 26 may be of any suitable configurations, but it has been found that oblique areas facilitate fabrication of the positioning form or base member 20.

Figure 6:
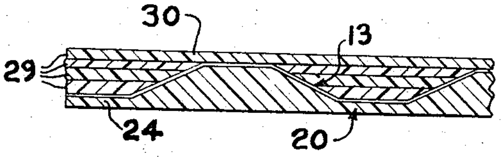
FIG. 6 is a cross-sectional and elevational view illustrating one form of moldable covering, before compression, for the base shown in FIG. 4.

After a thermopile chain 13 is suitably positioned into the base member 20, the positions may be secured by placing moldable material 29, which may be in sheet form, over the base 20, to form a thermal resistant top member 30 covering the wires of thermopile chain 13, as shown in FIG. 6, and then integrally molding the material 29 to the preform base member 20. It is preferable that valleys 24 of base 20 be completely filled by the moldable material 29.

Another material that may be employed to mold thermal resistant members 20 and 30 for use at high temperatures is moldable ceramic such as 99.7% pure alumina. In connection with a thermopile strip comprising alternate lengths of platinum and platinum-10% rhodium would be suitable.

FIGS. 4 and 5 also illustrate why it is impossible for adjacent thermopile strips 10 to "short out" when the preferred form of preform base 20 is employed. While the width of the undulations 22 and 24 is substantially equal to the width of the individual strips 10 in FIG. 5, the alternate lengths 14 of a strip 10 are immediately adjacent to the notches or spacings 12*a* between the alternate lengths 12 of an adjacent strip 10. Therefore at the intersection of diagonal areas between adjacent rows of undulations, the only region where adjacent strips 10 might otherwise contact each other, the alternate lengths of metal 12 and 14 are laterally displaced from corresponding lengths 12 and 14 in an adjacent strip by at least the width of one of said lengths.

Figure 8:
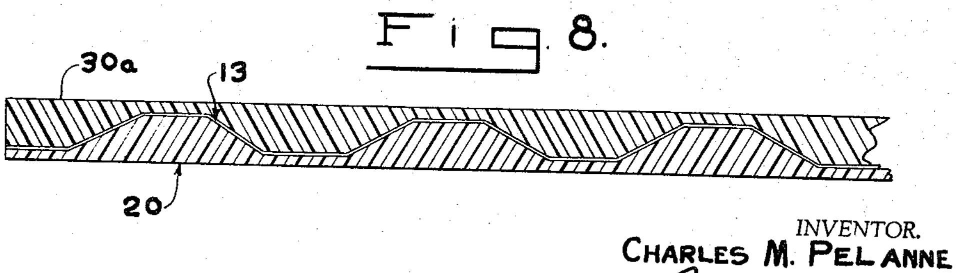
FIG. 8 is a view similar to FIG. 6 illustrating an alternate form of covering in connection with the form base shown in FIG. 4 prior to assembly.

Alternatively, the thermopile chain 13 may be wedged in position by interlocking the base member 20 with a corresponding top member 30*a*, as illustrated in FIG. 8 and then suitably bonding, as by molding, the base 20 and top 30*a* members together.

Figure 7:
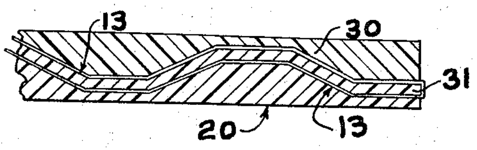
FIG. 7 is a view similar to FIG. 6 illustrating the manner by which a plurality of thermopile chains may be stacked in a single thermopile generator unit.

The E.M.F. (electromotive force) output of a single thermopile generator may be increased where desired by stacking a plurality of thermopile chains 13 between the base 20 and moldable cover 30 in the manner shown in FIG. 7. Each of the chains 13 is electrically insulated from an adjacent layer by means of moldable strips or sheets 31 which may be of the same material as the base 20 and cover 30. A terminal end of one chain is suitably connected to a corresponding terminal end of the next adjacent chain. Alternatively, the thermopile strips 10 within a stack of rows may be interconnected and then the several stacks of rows interconnected.

Figure 14:
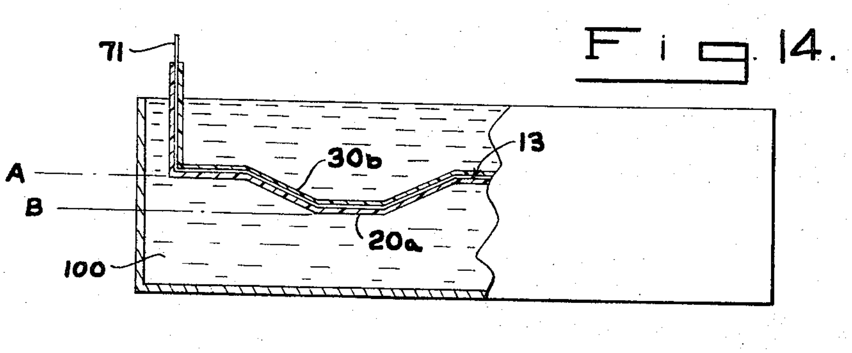
FIG. 14 is a cross-sectional and elevational view of a heat flow meter embodying the invention and immersed in a receptacle of liquid.

FIG. 14 illustrates how the base member may also be modified when it is desired to provide a heat flow meter for measuring the heat transfer through a liquid body. The base member 20*a*, there shown, is preformed to provide a bottom covering sufficiently rigid for the thermopile chain 13 to define and maintain different thermal planes without materially detracting from the heat transfer characteristics of the liquid 100, i.e., the liquid 100 fills the crests and valleys of both the top member 30*b* and the base member 20*a* so that the heat transfer measurement is essentially from thermal plane B to thermal plane A. The integrally molded construction provides fluid impervious characteristics which adapt it for use in fluids where other constructions have proven unsatisfactory. The terminal leads 71 and 72, only lead 71 being shown in FIG. 14, may also be covered with the moldable composition to further enhance the fluid impervious characteristics of the heat flow meter of this invention. Alternatively, a fluid tight boot may be provided for the leads to prevent "shorting" when immersed in liquid.

Figure 12:
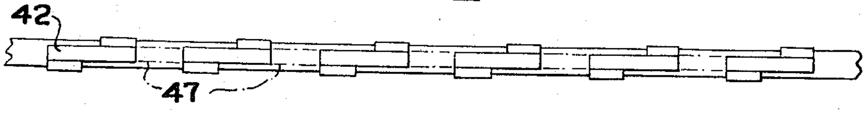
FIG. 12 is an end elevational view of the thermopile chain of FIG. 10 shown in connection with the positioning form of FIG. 8 illustrating the removed sections of the center connecting wire after assembly.
Figure 9:
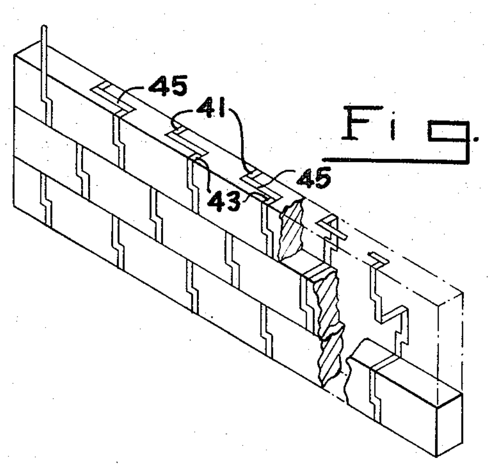
FIG. 9 is a fragmentary pictorial view of an alternate positioning form base together with a thermopile chain.
Figures 10, 11:
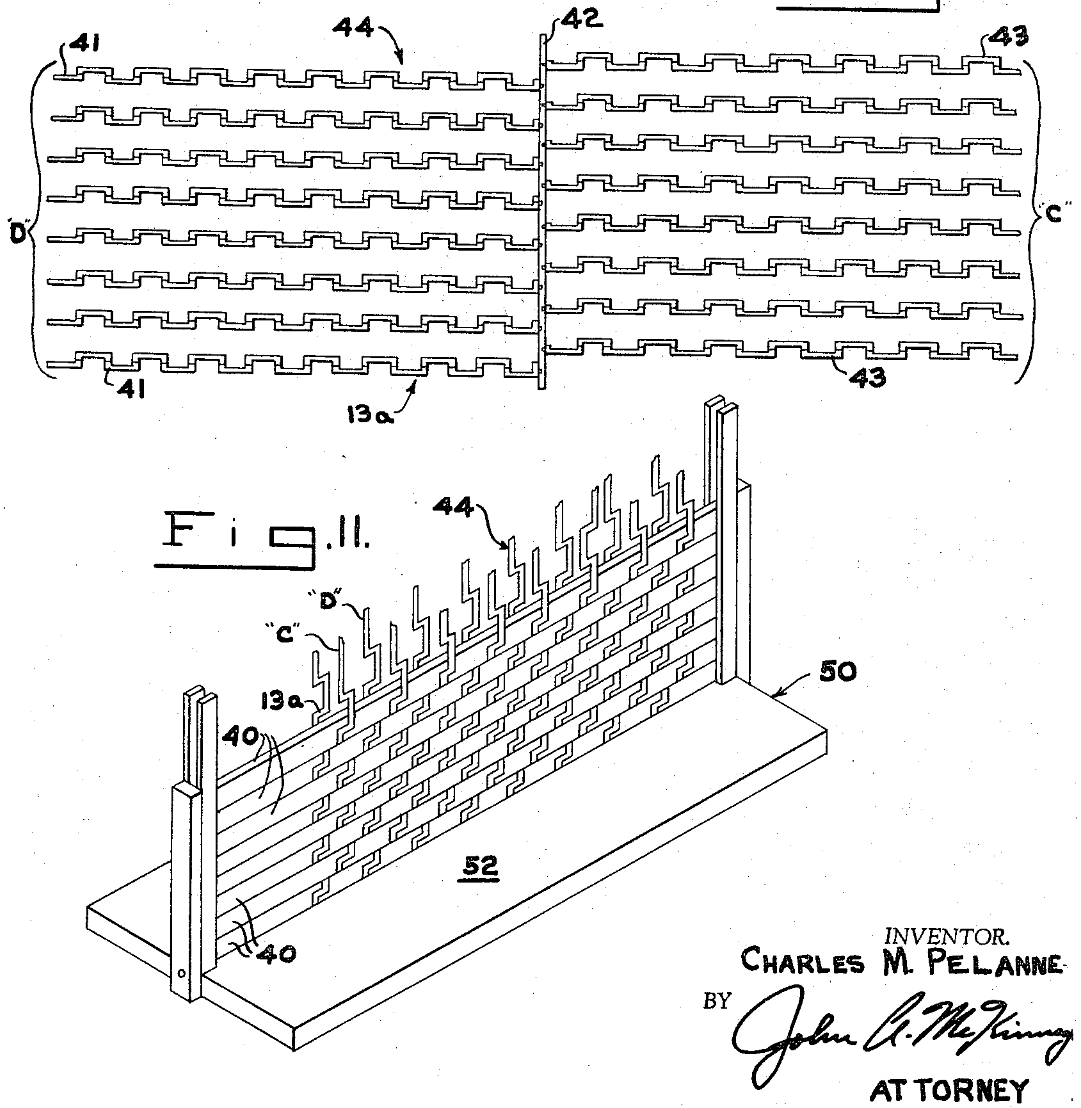
FIG. 10 is a plan view of the preliminary layout of the thermopile chain, shown in FIG. 9, prior to assembling.
FIG. 11 is a pictorial view of the positioning form base and thermopile chain, shown in FIG. 9, in connection with an assembly jig.

While basket weaving of a thermopile chain with a positioning form has been previously suggested, it has been done only in connection with a resilient positioning form. To my knowledge such weaving has not been done with a relatively rigid preform. In FIG. 11 is illustrated a method of interlacing or basket weaving a thermopile chain 13*a* with a plurality of form strips 40 molded from material such as asbestos paper impregnated with phenolic resin. Two sets of thermopile wire strips C and D are suitably connected to a common center wire 42 to form a web 44 or preliminary stage of a thermopile chain 13*a* as shown in FIG. 10. The web 44 is placed in a weaving jig 50 with the center wire 42 resting on the base 52 of the jig 50. The first form strip 40 is placed in the jig 50 and centered above the center wire 42 with the wires of one set C positioned on one side and the wires of the other set D positioned on the opposite side of the form strip 40. As successive form strips 40 are inserted in the jig 50 the sets of wires C and D are alternately shifted from one face of the form strip to the opposing face. The ends of each wire 43 in set C are then joined with ends 41 of the wires of the other set D with connecting wires 45 as shown in FIG. 9. The thermopile assembly is then removed from the weaving jig 50 and alternate sections 47 of center wire 42 are removed as may be seen in FIG. 12 to form a continuous circuit thermopile chain.

A thermopile unit as made by either of the described methods is inserted into the central opening 69 of a central electrical insulating plate or frame 70 and assembled therewith. It is important that plate 70 be of the same material as members 20 and 30. A terminal block 60 is provided with suitable terminal connections 61 and 62 for leads 63 and 64 to the measuring instrument 65 and with connections 66 and 67 for thermocouple 90 and leads 93 and 95 to instrument 97.

The terminal block 60 may comprise the same material as the strip positioning form(s) 20 or 40. The lead wires 71 and 72 of the thermopile chain 13 or 13*a* are then connected to terminals 61 and 62. Insulating sheet material 80, which may be in the form of impregnated asbestos paper, is then placed to cover over the exposed areas of the thermopile chain 13. A thermocouple 90 is then inserted through a pair of central positioning slots 91 and 92 of each of two additional insulating sheets 94 similar to sheets 80 and the additional sheets 94 are then placed over the assembly with the junctions 96 of each thermocouple 90 being exposed on the exterior face. The insertion of sheets of moldable material 80 intermediate the thermopile chain 13 and the thermocouple 90 provides insurance against electrical "shorting." The whole assembly is then pressure molded into an integral unit.

The use of moldable material as a thermal resistance core is known in the art, however, it has not been previously known to integrally mold retention layers onto the core to provide a bond between laminates of thermopile unit and to fixedly position the thermopile chain. The devices of the prior art have relied upon cements and adhesives to bond laminates of thermopile units. While these are satisfactory for some applications they deteriorate and subsequently fail when subjected to elevated temperatures.

While the invention has heretofore been described in connection with one form of thermopile chain, it is to be understood that the invention is not necessarily limited to the method of producing a thermopile wire. For example, in FIG. 13 is illustrated a thermopile chain 13*b* formed from a single piece of metal 101. A metal different from 101 is deposited on alternate sections 102, after predetermined sections of the metal 101 are suitably masked, such as by spraying, painting, dipping, or in any other suitable method. A rod-like wire may also be plated in the manner just described. The covering, or plating metal should have a lower electrical resistance than the base metal so that the generated E.M.F. is from high to low resistance contacts. In any event the thermopile chain is bent to present a thermopile junction of dissimilar metals at each of the crests and valleys as defined by the preforms of this invention.

Although the thermoelectric generator has been described in detail as to its component parts, it will be understood that such detail is for the purpose of illustration and not by way of limitation. The appended claims are therefore intended to cover any modifications coming within the true scope of the invention.

What I claim and desire to secure by Letters Patent of the United States is:

1. The method of making a thermoelectric generator comprising: molding a thermal resistance, electrically non-conductive base member having planar sets of alternate crests and valleys defining first and second planes on the upper surface of said base member; disposing a thermopile chain of lengths of dissimilar metals arranged in alternate fashion on the upper surface of said base member with alternate junctions of said dissimilar metals being positioned at different planes; said chain having leads extending from the ends thereof; covering said thermopile chain and said base member with additional molding material, leaving terminal portions of said leads exposed for connections; integrally molding said additional molding material to said base thereby providing a homogeneous unit; positioning a surface thermocouple on said moldable material, said integral molding bonding said base member, said thermopile chain, said leads, and said surface into an integral unit.

2. The method of making a thermoelectric generator comprising:

(a) providing a plurality of relatively rigid electrically non-conductive bar members;
(b) providing two sets of thermopile chains interconnected by connecting portions of center wire and forming therewith a web;
(c) positioning a first of said bar members on said center wire with a first of said sets being on one side of said first bar member and with the second of said sets being on the opposite side of said bar member;
(d) shifting said sets over said first bar member to transpose said first sets from said one side to said opposing side and to transpose said second set from said opposing side to said first side;
(e) placing a second of said bar members over the portions of said sets crossing over said first bar member;
(f) shifting said sets over said second bar member to transpose said first set from said opposing side to said first side and to transpose said second set from said first side to said opposing side;
(g) alternately shifting said sets about additional of said bar members;
(h) the shifting of said sets about said bar members also locating on separate planes alternate thermopile junctions of said thermopile chain;
(i) interconnecting each of the chains of one set with a chain of the other set at a position corresponding to the last placed of said bar members;
(j) covering exposed areas of said thermopile chain with moldable material; and
(k) molding said moldable material into an integral unit with said bar members.

3. The method as described in claim 2, wherein: said sets of thermopile chains are interconnected by a common center wire; and
sections of said center wire are removed, which sections are opposite the interconnecting portions of said chains.

References Cited

UNITED STATES PATENTS

| | | | |
|---|---|---|---|
| 1,528,383 | 3/1925 | Schmidt | 136—5 X |
| 1,610,271 | 12/1926 | Evins | 136—4.4 |
| 1,638,943 | 8/1927 | Little | 136—5.22 |
| 2,493,651 | 1/1950 | Boelter et al. | 136—4 |
| 2,666,089 | 1/1954 | Gier et al. | 136—4 |

(Other references on following page)

| | | | |
|---|---|---|---|
| 2,807,657 | 9/1957 | Jenkins et al. | 136—5 |
| 3,018,311 | 1/1962 | Bagno et al. | 136—4 |
| 3,019,278 | 1/1962 | Fisher | 136—4 |

FOREIGN PATENTS

| | | |
|---|---|---|
| 145,685 | 5/1936 | Austria. |

OTHER REFERENCES

Gilbo: "A.S.T.M. Bulletin," No. 212, February 1956, pp. 68–74.

Huebscher et al.: "ASH & VE Trans.," No. 1453, June 1952, pp. 275–85.

Wilson et al.: "Phys. Soc. London, Proc.," vol. 32, 1920, pp. 326–9 and 335–9.

WINSTON A. DOUGLAS, *Primary Examiner.*

JOSEPH REBOLD, J. BARNEY, J. MACK, A. M. BEKELMAN, *Assistant Examiners.*